United States Patent [19]

Ishibashi et al.

[11] Patent Number: 5,554,489
[45] Date of Patent: Sep. 10, 1996

[54] METHOD OF FORMING A FINE RESIST PATTERN USING AN ALKALINE FILM COVERED PHOTORESIST

[75] Inventors: Takeo Ishibashi; Eiichi Ishikawa; Itaru Kanai, all of Hyogo, Japan

[73] Assignee: Mitsubishi Denki Kabushiki Kaisha, Tokyo, Japan

[21] Appl. No.: 353,256

[22] Filed: Dec. 2, 1994

Related U.S. Application Data

[63] Continuation of Ser. No. 103,639, Aug. 11, 1993, abandoned.

[30] Foreign Application Priority Data

Aug. 20, 1992 [JP] Japan ..................... 4-221444

[51] Int. Cl.⁶ ..................................... G03K 5/00
[52] U.S. Cl. .................. 430/326; 430/156; 430/166; 430/273.1; 430/327; 430/330; 430/510; 430/950
[58] Field of Search ..................... 430/156, 166, 430/273, 326, 327, 330, 510, 950

[56] References Cited

U.S. PATENT DOCUMENTS

| | | | |
|---|---|---|---|
| 4,769,306 | 9/1988 | Oberhauser et al. | 430/950 X |
| 4,816,380 | 3/1989 | Covington et al. | 430/326 X |
| 4,950,577 | 8/1990 | Grieve et al. | 430/166 X |

FOREIGN PATENT DOCUMENTS

| | | |
|---|---|---|
| 3342579A1 | 5/1984 | Germany. |
| 3736980A1 | 5/1989 | Germany. |
| 4117127A1 | 11/1992 | Germany. |
| 1-231038 | 9/1989 | Japan. |
| 1-231040 | 9/1989 | Japan. |
| 2-212851 | 8/1990 | Japan. |

OTHER PUBLICATIONS

"High–Aspect–Ratio Alkaline Surface Treatment Method of Dyed Photoresist" Endo et al. Jap. Journal of App. Phys. vol. 28, No. 3, Mar. 1989 pp. 549–552 Dupont Info. Bulletin–Teflon pp. 1–2.

"Introduction to Microlithography" Thompson et al. A.C.S. Symposium Series Mar. 20–25, 1983 ACS Wash. D.C. 1983 pp. 111–116.

"A New Photolithography Technique with Anitreflective Coating on Resist: ARCOR", by T. Tanaka et al, J. Electrochem. Soc., vo. 137, No. 12, Dec. 1990, pp. 3900–3905.

"LENOS: Latitude Enhancement Novel Single Layer Lithography", by Sachiko Ogawa, et al, Journal of Photopolymer Science and Technology, vol. 2, No. 3, 1989, pp. 375–382.

Primary Examiner—George F. Lesmes
Assistant Examiner—Bernard P. Codd
Attorney, Agent, or Firm—Lowe, Price, Leblanc & Becker

[57] ABSTRACT

A forming method of a fine resist pattern improve so as to form a fine pattern of high accuracy can be obtained. A positive-type photoresist 1 including naphthoquinone diazide and novolak resin is applied on a substrate. An anti-reflection film adjusted to alkalinity is applied on positive-type photoresist 1. Positive-type photoresist 1 on which anti-reflection film 9 is applied is selectively irradiated. Positive-type photoresist 1 is developed.

13 Claims, 7 Drawing Sheets

IN OPTIMUM FOCUS
(a)

OUT OF FOCUS
(b)

(a)          (b)

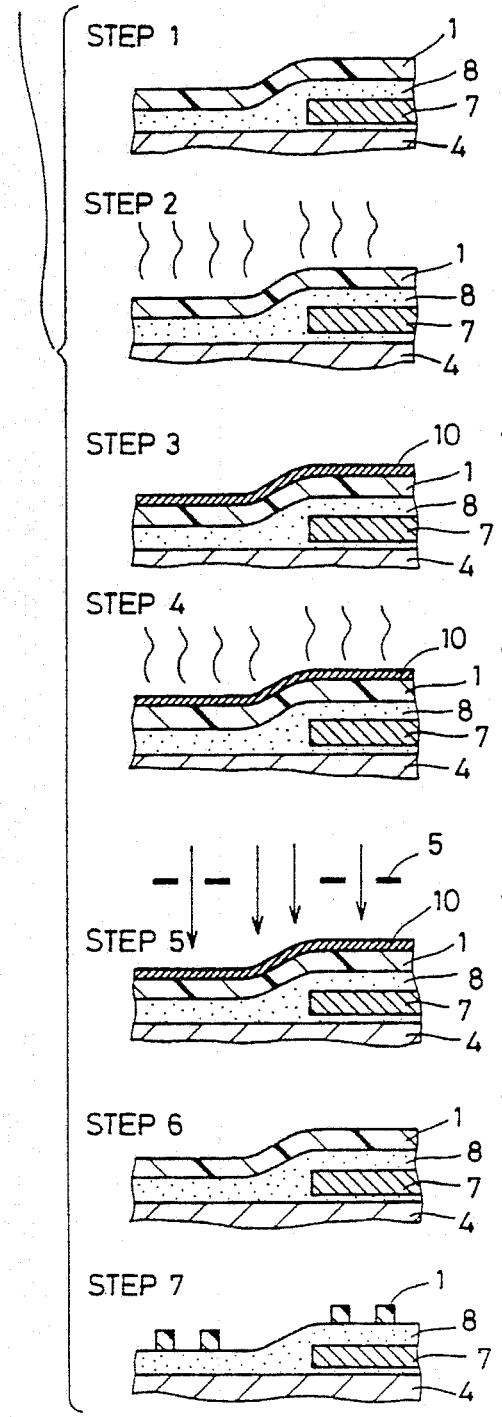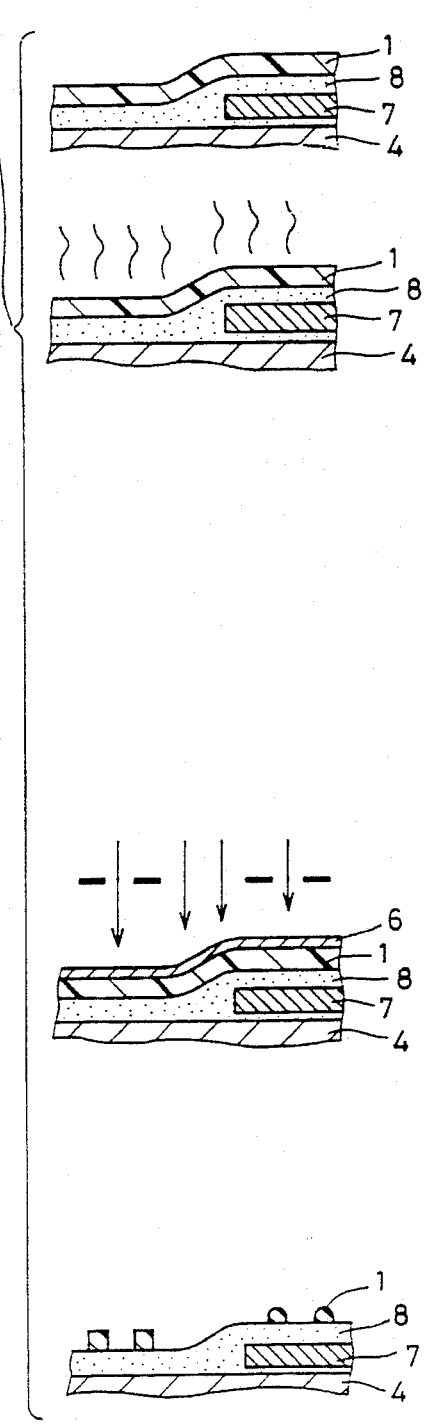
FIG. 11A
FIG. 11B PRIOR ART

METHOD OF FORMING A FINE RESIST PATTERN USING AN ALKALINE FILM COVERED PHOTORESIST

This application is a continuation of application Ser. No. 08/103,639 filed Aug. 11, 1993 abandoned.

BACKGROUND OF THE INVENTION

1. Field of the Invention

The present invention relates generally to a forming method of a fine resist pattern, and more particularly to an improved forming method of a fine resist pattern with high precision.

2. Description of the Background Art

FIG. 1 is a schematic diagram showing the principle of an ARCOR (Anti Reflective Coating on Resist) method.

Referring to FIG. 1, an anti-reflection film 2 is formed on the upper surface of a positive-type photoresist 1. Air 3 is present over anti-reflection film 2. Where a refraction index of positive-type photoresist 1 is $n_R$, a refraction index $n_A$ of anti-reflection film 2 is the square root of $n_R$. A film thickness of anti-reflection film 2 is $\lambda_{exp}/4n_A \times n$ ($\lambda_{exp}$ is a wavelength of exposure light $e_1$, and n is an odd integer). Where these requirements are established, reflected light $e_2$ reflected at the interface of air 3 and anti-reflection film 2 to be directed to positive-type photoresist 1, and reflected light $e_3$ reflected at the interface of anti-reflection film 2 and positive-type photoresist 1 to be directed to positive-type photoresist 1 mutually cancel, so that substantial reflection is eliminated.

With the ARCOR method, multiple reflection within a film, which may be a problem in usual photolithography using a single photoresist layer, is suppressed.

Specifically, referring to FIG. 2, a curved line (1) shows the relation between a resist film thickness and resist line width in the case of using a single photoresist layer. A curved line (2) shows the relation between a resist film thickness and resist line width in the case of employing the ARCOR method. As can be seen from the figure, in the ARCOR method, a change of the dimension of a resist pattern can be suppressed irrespective of a change of the resist film thickness, and in turn, a stable resist pattern can be obtained.

Although the ARCOR method is a superior method of suppressing multiple reflection within a film, as described above, undesired reduction of a resist may occur in the case of out of focus as shown in FIG. 3.

FIG. 3 (a) shows a cross sectional shape of a resist pattern in optimum focus, and FIG. 3 (b) shows a cross sectional shape of a resist pattern out of focus. Referring to FIG. 3 (b), undesired reduction occurs on an upper portion 1a of resist 1.

As shown in FIG. 4, defocus occurs, for example, when positive-type photoresist 1 applied on a substrate 4 with a step is exposed by a projection aligner. Specifically, when a focus is set on an A portion, a B portion is out of focus, whereby undesired reduction occurs on upper portion 1a of positive-type photoresist 1.

The problem of undesired reduction on a resist also occurs in a CEL technology (Contrast Enhanced Photolithography).

A conventional CEL technology will hereinafter be described briefly.

FIG. 5 shows schematic diagrams for the comparison of photolithography (b) to which the CEL technology is adapted, and usual photolithography (a) to which the CEL technology is not adapted.

Referring to FIG. 5 (a) (1), positive-type photoresist 1 is applied on substrate 4. Referring to FIG. 5 (a) (3), positive-type photoresist 1 is selectively irradiated with light using a mask 5. Referring to FIG. 5 (a) (4), positive-type photoresist 1 is developed. According to this method, as shown in FIG. 5 (a) (4), the problems of poor contrast and poor resolution arise. The CEL technology was developed for enhancement of resolution.

Referring to FIG. 5 (b) (1), positive-type photoresist 1 is applied on substrate 4. Referring to FIG. 5 (b) (2), a contrast enhancement layer 6 is applied on positive-type photoresist 1. As is also disclosed in Japanese Patent Laying-Open No. 2-212851, contrast enhancement layer 6 contains a material whose light transmission rate increases as it is exposed to exposure light (referred to as a color fading pigment component). More specifically, absorption of an exposure light wavelength, which is large before exposure, is gradually reduced as the exposure proceeds. Diazonium salt, stilbazolium salt, aryl nitroso salt and the like are known as color fading pigment components. Phenol-type resin is used as a coating forming component.

Referring to FIG. 5 (b) (3), positive-type photoresist 1 on which CEL layer 6 is applied is selectively irradiated using mask 5. Referring to FIG. 5 (b) (4), positive-type photoresist 1 is developed. According to the method, CEL layer 6 formed on positive-type photoresist 1 becomes substantially transparent at the exposed portion, in turn enhancing contrast between the exposed portion and an unexposed portion. As a result, a resist pattern of high resolution can be obtained.

In the CEL method described above, a resist pattern of high resolution can be formed. As shown in FIG. 6, however, the problem that a film thickness of resist 1 is reduced arises in the case of out of focus.

As described above, in the lithography using a conventional photoresist, the problem that a film thickness of a resist is reduced arises in the case of out of focus. In exposure by a projection aligner, the reduction due to the out-of-focus is especially significant. The reduction of the film thickness of the resist is caused by solubility of the surface of the resist in developer.

A LENOS (Latitude Enhancement Novel Single Layer Lithography) method is known as a method improving resistance of a surface of a resist to solution in developer (Journal of Photopolymer Science and Technology Vol. 2, No. 3, 1989). In the LENOS method, a resist is immersed in alkali liquid to make the surface of the resist insoluble.

In this method, however, a troublesome process to immerse a resist in alkali liquid is indispensable, which complicates a manufacturing process of a semiconductor device.

SUMMARY OF THE INVENTION

The present invention is made to solve the above mentioned problems. One object of the present invention is to provide a forming method of a fine resist pattern improved so as to prevent reduction in a film thickness of a resist even in the case of out of focus in exposure.

Another object of the present invention is to provide an ARCOR method improved so as to prevent reduction in a film thickness of a resist even in the case of out of focus in exposure.

Still another object of the present invention is to provide a CEL technology improved so as to prevent reduction in a film thickness of a resist even in the case out of focus in exposure.

A further object of the present invention is to provide an ARCOR method and a CEL technology improved so as to prevent reduction in a film thickness of a resist without complicating a manufacturing process thereof.

In a forming method of a positive-type photoresist in accordance with a first aspect of the present invention, a positive-type photoresist including naphthoquinone diazide and novolak resin is initially applied on a substrate. An application film adjusted to alkalinity is applied on the positive-type photoresist in order to make the surface of the positive-type photoresist insoluble. The positive-type photoresist having the application film applied thereon is selectively irradiated with light. The positive-type photoresist is developed.

In a forming method of a fine resist pattern in accordance with a second aspect of the present invention, a positive-type photoresist including naphthoquinone diazide and novolak resin is applied on a substrate. A contrast enhancement layer adjusted to alkalinity is applied on the positive-type photoresist. The positive-type photoresist having the contrast enhancement layer applied thereon is selectively irradiated with light. The positive-type photoresist layer is developed.

In a forming method of a fine resist pattern in accordance with a third aspect of the present invention, a positive-type photoresist including naphthoquinone diazide and novolak resin is initially applied on a substrate. An anti-reflection film adjusted to alkalinity is applied on the positive-type photoresist. The positive-type photoresist having the anti-reflection film applied thereon is selectively irradiated with light. The positive-type photoresist is developed.

According to the forming method of a fine resist pattern in the first aspect of the present invention, an application film adjusted to alkalinity is applied on a positive-type photoresist including naphthoquinone diazide and novolak resin, whereby crosslinking reaction of the naphthoquinone diazide and the novolak resin included in the surface of the positive-type photoresist occurs with alkali included in the application film as a catalyst, causing the surface of the positive-type photoresist to change into an insoluble substance.

According to the forming method of a fine resist pattern in the second aspect of the present invention, a contrast enhancement layer adjusted to alkalinity is applied on the positive-type photoresist including naphthoquinone diazide and novolak resin, whereby crosslinking reaction of the naphthoquinone diazide and the novolak resin included in the surface of the positive-type photoresist occurs with alkali included in the contrast enhancement layer as a catalyst, causing the surface of the positive-type photoresist to change into an insoluble substance.

According to the forming method of a fine resist pattern in the third aspect of the present invention, an anti-reflection film adjusted to alkalinity is applied on a positive-type photoresist including naphthoquinone diazide and novolak resin, whereby the crosslinking reaction of the naphthoquinone diazide and the novolak resin included in the surface of the positive-type photoresist occurs with alkali included in the anti-reflection film as a catalyst, causing the surface of the positive-type photoresist to change into an insoluble substance.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11A shows partial cross sectional views of a semiconductor device in respective steps in sequence of a forming method of a fine resist pattern in accordance with another embodiment of the present invention, and FIG. 11B shows cross sectional views of a semiconductor device in respective steps in sequence of the conventional CEL technique, for the purpose of comparison.

DESCRIPTION OF THE PREFERRED EMBODIMENTS

Figure 1:
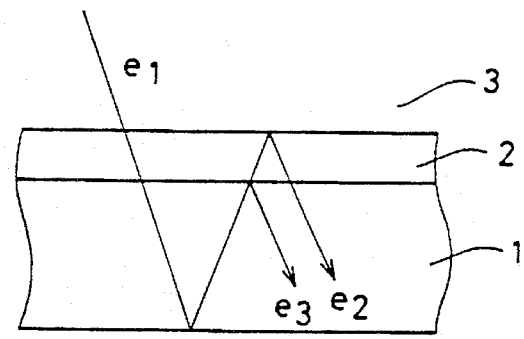
FIG. 1 is a schematic diagram showing the principle of an ARCOR method.
Figure 2:
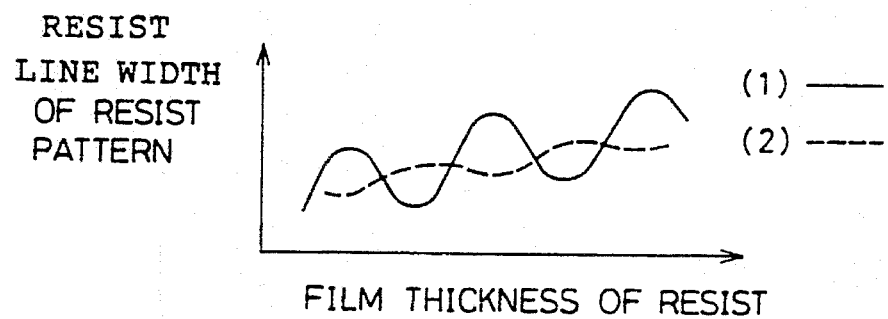
FIG. 2 is a graph showing the relationship between the resist film thickness and resist line width using a single photoresist layer and employing the ARCOR method.
Figure 3:
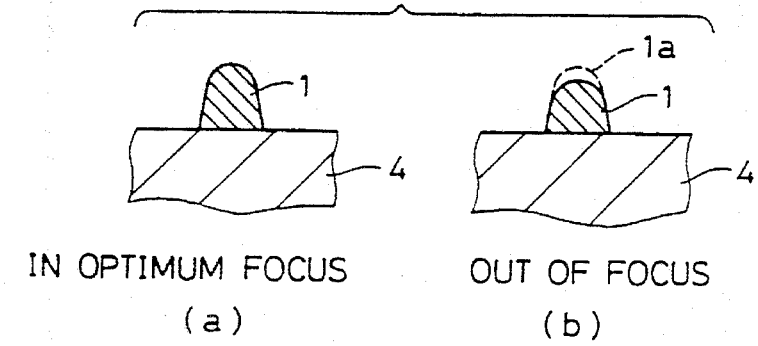
FIG. 3 (a) is a diagram showing the shape of a resist pattern in focus, and FIG. 3 (b) is a diagram showing the shape of a resist pattern whose resist is reduced because of defocus.
Figure 4:
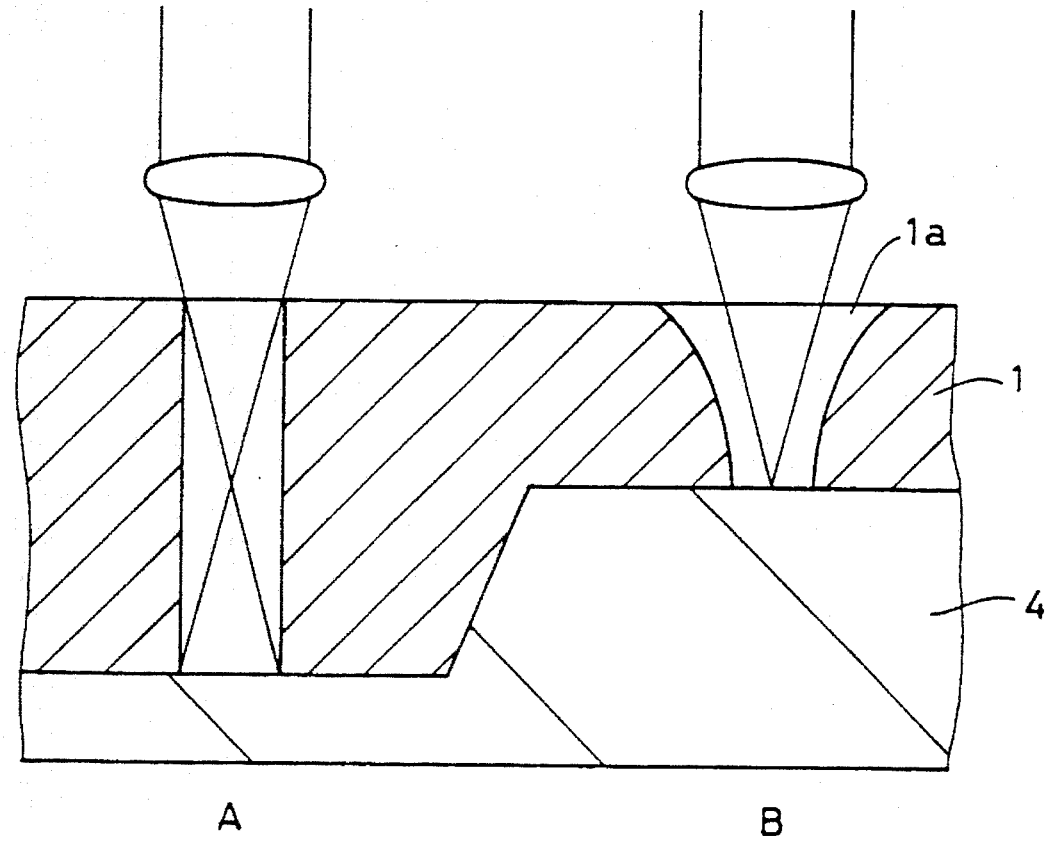
FIG. 4 is a schematic diagram showing undesired reduction of a resist because of defocus in exposure by a projection aligner.
Figure 5:
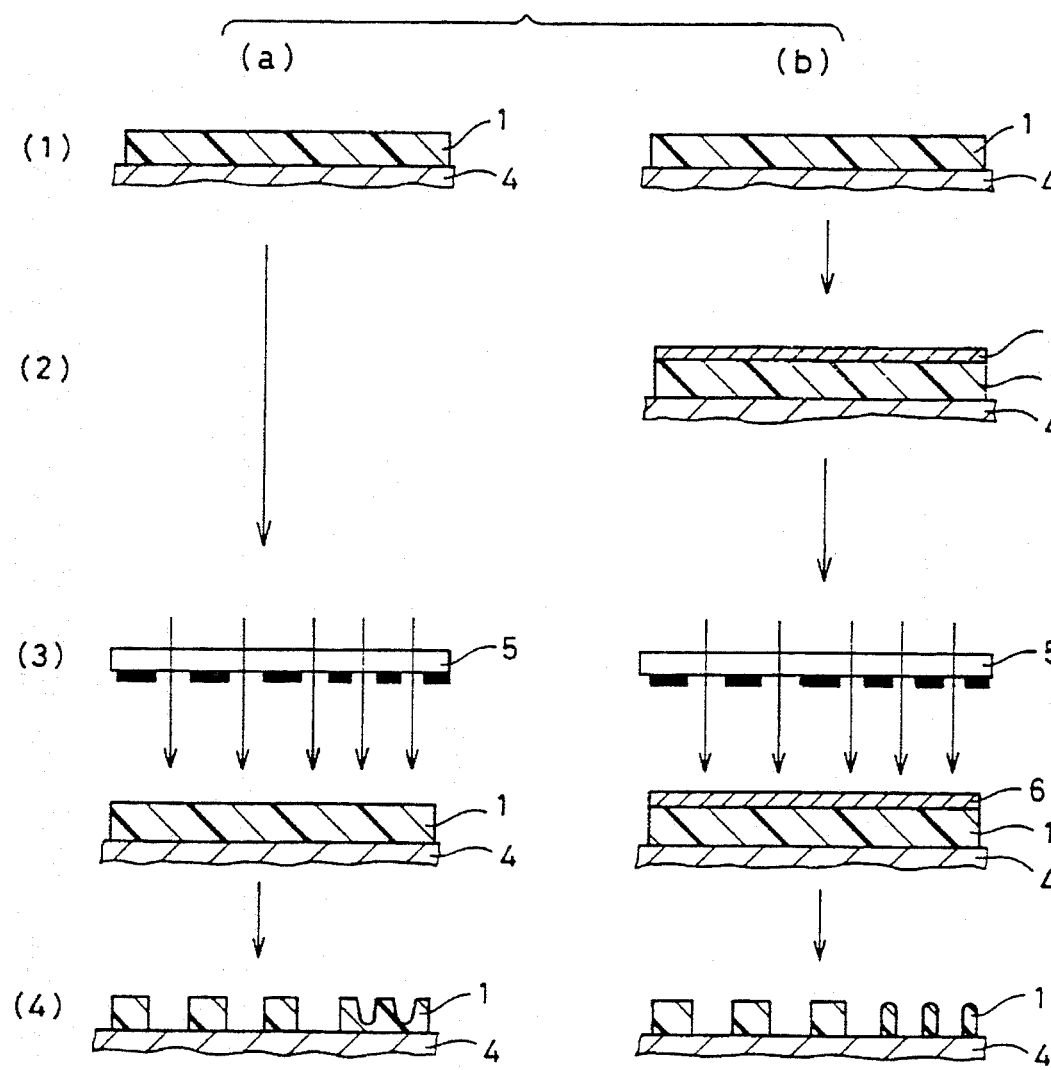
FIG. 5 (a) is a schematic diagram showing normal photolithography in a conventional case, and FIG. 5 (b) is a schematic diagram showing a conventional CEL technique.
Figure 6:
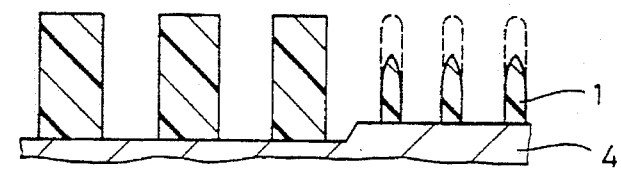
FIG. 6 is a schematic diagram showing undesired reduction of a resist because of defocus in the conventional CEL technique.
Figure 7:
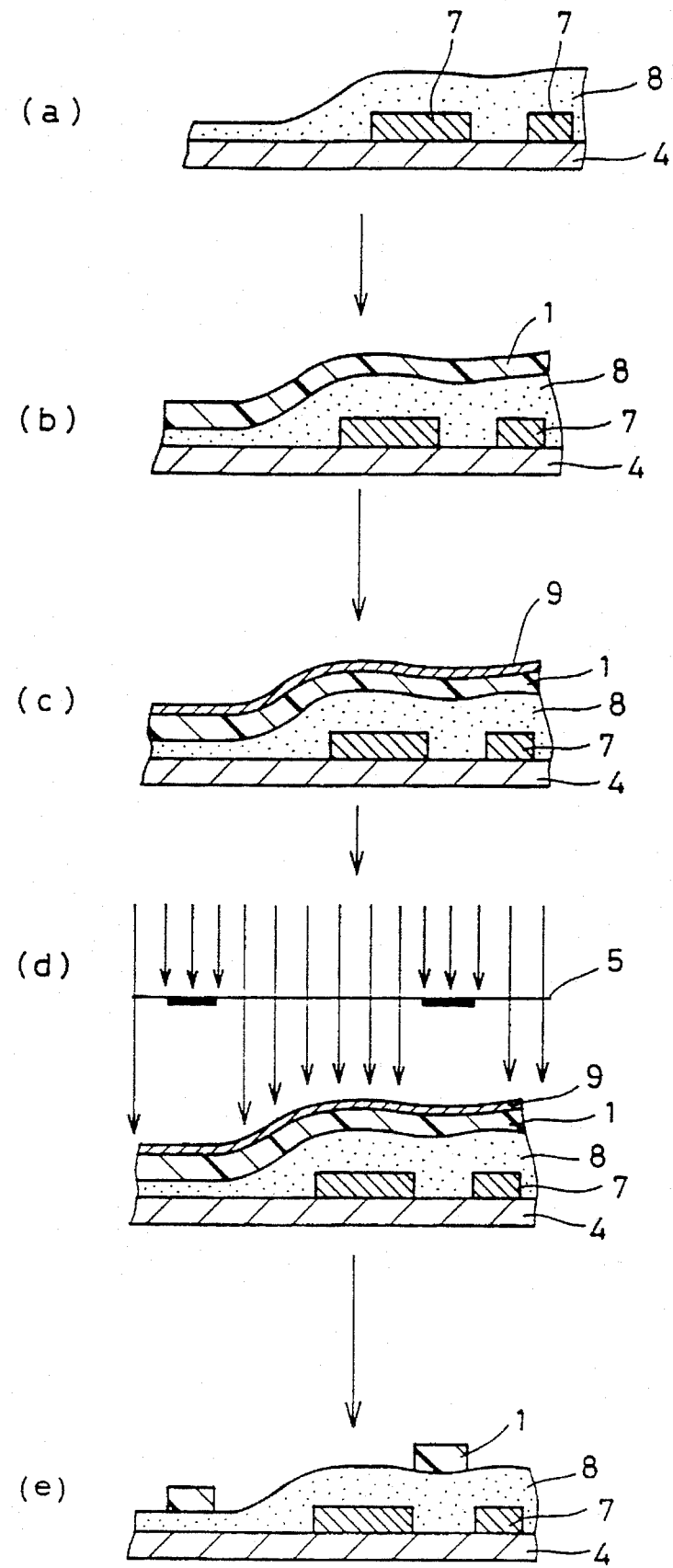
FIG. 7 shows cross sectional views of a semiconductor device in respective steps in sequence of a forming method of a fine resist pattern in accordance with one embodiment of the present invention, showing an improvement of the conventional ARCOR method.

FIG. 7 shows partial cross sectional views of a semiconductor device in respective steps in sequence of a forming method of a fine resist pattern in accordance with one embodiment of the present invention.

Referring to FIG. 7 (a), an oxide film 8 is formed on a substrate 4 including a step 7.

Referring to FIG. 7 (b), a positive-type photoresist 1 including naphthoquinone diazide and novolak resin is applied on oxide film 8. The surface of oxide film 8 may be processed with hexamethyldisilazane or the like before application of positive-type photoresist 1, for enhancing adhesion of positive-type photoresist 1 and oxide film 8.

Referring to FIG. 7 (c), an anti-reflection film 9 adjusted to alkalinity is applied on positive-type photoresist 1. Anti-reflection film 9 includes water soluble polymers, such as polyvinyl alcohol type polymers, polyacrylic acid type polymers, and polyvinyl amine type polymers. The pH of anti-reflection film 9 is adjusted to approximately 10 by organic alkali, such as tetramethylammonium hydroxide. The refraction index $n_A$ of anti-reflection film 9 is adjusted to the square root of the refraction rate $n_R$ of positive-type photoresist 1. The adjustment of the refraction rate is carried out through adding polymers including fluorine, or surfactant including fluorine. The film thickness of anti-reflection film 9 is made to be $\lambda_{exp}/4n_A \times n$ ($\lambda_{exp}$ denotes a wavelength of exposure light, and n is an odd integer) through adjustment of the number of revolutions of a spin coater.

Figure 8:
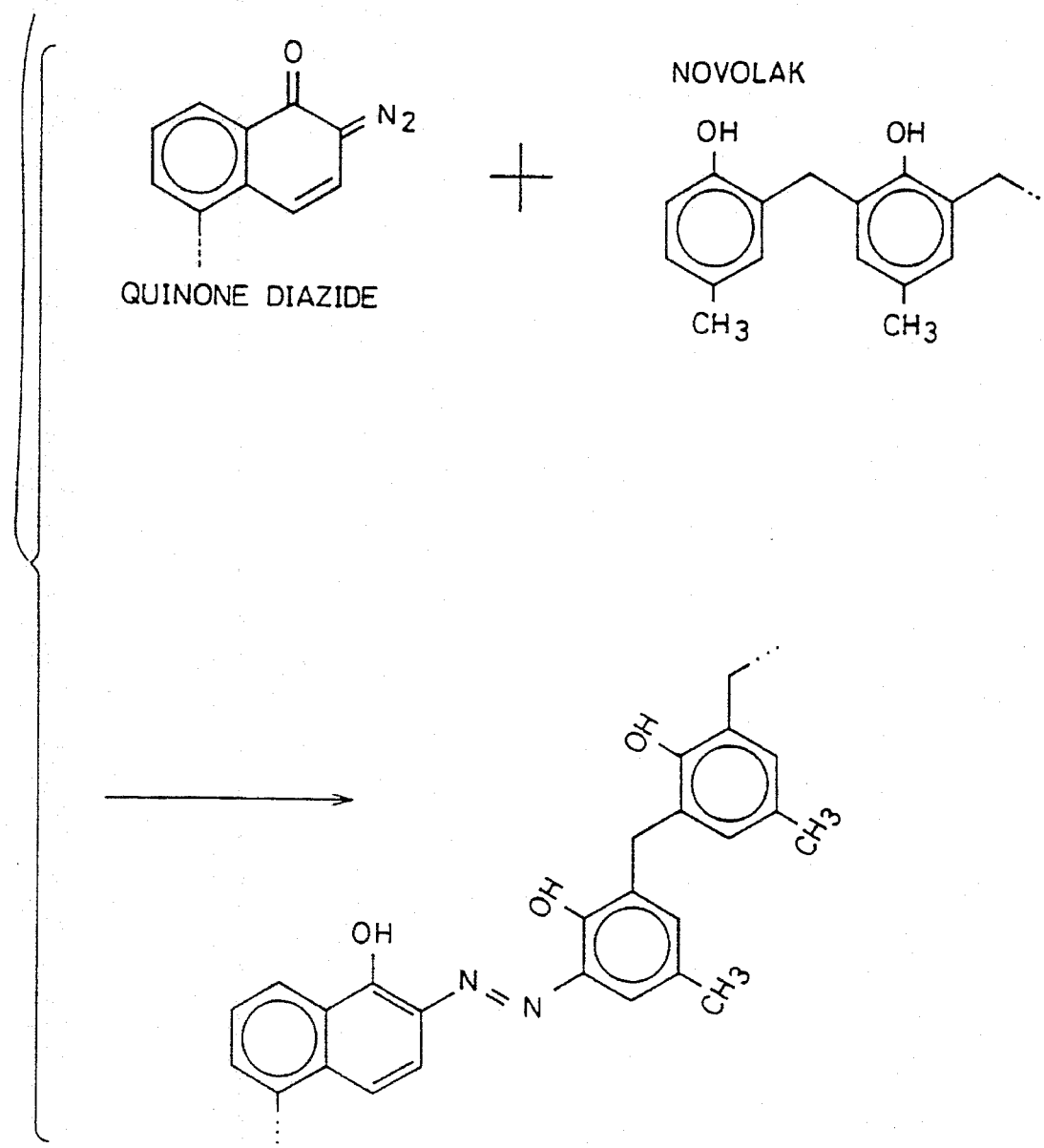
FIG. 8 shows an expression showing a diazide-coupling reaction of naphthoquinone diazide and novolak resin, with alkali as a catalyst.

Since anti-reflection film 9 adjusted to alkalinity is applied on positive-type resist 1 including naphthoquinone diazide and novolak resin the crosslinking reaction of the naphthoquinone diazide and the novolak resin included in the surface of positive-type resist 1 occurs with alkali included in anti-reflection film 9 as a catalyst as shown in FIG. 8, causing the surface of the resist to change into an insoluble substance. Accordingly, a troublesome step, such as a step of immersing a resist in alkali liquid in the conventional LENOS method is not required in the present embodiment.

Figure 9:
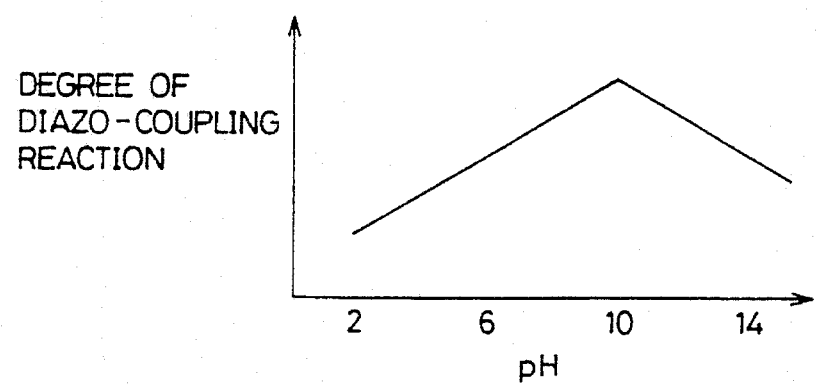
FIG. 9 is a graph showing the relation between a degree of diazo-coupling reaction of naphthoquinone diazide and novolak resin, and pH.

FIG. 9 is a graph showing the relation between pH and a degree of diazide-coupling reaction of naphthoquinone diazide and novolak resin. The degree of diazide-coupling reaction of naphthoquinone diazide and novolak resin attains a maximum value at pH10.

Turning back to FIG. 7 (c), heat treatment may be performed at the temperature 80-100° C. in order to enhance adhesion of anti-reflection film 9 and positive-type photoresist 1.

Referring to FIG. 7 (d), positive-type photoresist 1 on which anti-reflection film 9 is applied is selectively irradiated, using a mask 5.

Referring to FIG. 7 (e), positive-type photoresist 1 is developed. In the development, wet etching with organic solvent may be carried out for removing anti-reflection film 9, if necessary. Referring to FIG. 7 (e), a resist pattern is obtained through the development of positive-type photoresist 1.

Figure 10:
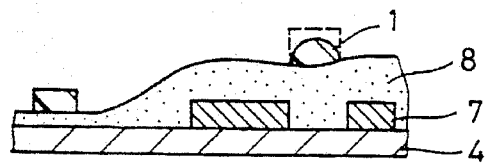
FIG. 10 (a) is a cross sectional view showing the shape of a resist obtained by the conventional ARCOR method, and FIG. 10 (b) is a cross sectional view showing the shape of a resist obtained by the ARCOR method in accordance with the present invention.
Figure 10:
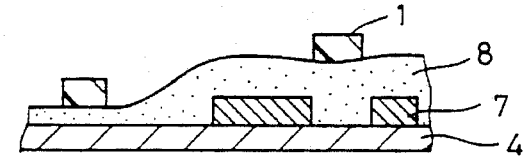

FIG. 10 shows, in comparison, a cross sectional view (a) of a resist pattern obtained using an anti-reflection film which is not adjusted to alkalinity (in the conventional ARCOR method), and a cross sectional view (b) of a resist pattern obtained in a method shown in FIG. 7, that is, using an anti-reflection film adjusted to alkalinity.

As is clearly shown in FIG. 10 (b), the use of the anti-reflection film adjusted to alkalinity lowers reduction of resist 1.

In addition, adaption of the ARCOR method suppresses multiple reflection in a film, and suppresses change in the resist line width irrespective of change in the thickness of the resist. As a result, the resist line width the resist pattern is made stable.

FIGS. 11A and 11B show partial cross section views of a semiconductor device in respective steps in sequence of a forming method of a fine resist pattern in accordance with another embodiment of the present invention, in comparison with those of the conventional CEL technique.

FIG. 11A is a method in accordance with the present embodiment, and FIG. 11B is that in accordance with the conventional CEL technique.

Referring to Step 1 in FIG. 11A, an oxide film 8 is formed on a substrate 4 including a step 7 in Step 1. A positive-type photoresist 1 including naphthoquinone diazide and novolak resin is applied on oxide film 8.

Referring to Step 2, positive-type photoresist 1 is pre-baked at the temperature 80-100° C.

Referring to Step 3, a contrast enhancement layer (CEL layer) 10 adjusted to alkalinity is applied on positive-type photoresist 1. The CEL layer includes a known color fading pigment component and a known coating forming component, such as components used in Japanese Patent Laying-Open Nos. 1-231038, 1-231040, and 2-212851. The pH value of CEL layer 10 is adjusted to approximately 10 with organic alkali, such as tetramethylammonium hydroxide.

Since CEL layer 10 adjusted to alkalinity is applied on positive-type photoresist 1 including naphthoquinone diazide and novolak resin, mixing occurs between the layers. The mixing causes diazo-coupling reaction of the naphthoquinone diazide and the novolak resin included in the surface of positive-type photoresist 1, as shown in FIG. 8, with alkali included in CEL layer 10 as a catalyst. This causes the surface of positive-type photoresist 1 to change into an insoluble substance.

Referring to Step 4, CEL layer 10 may be baked at the temperature 80°-100° C. for enhancing adhesion between CEL layer 10 and positive-type photoresist 1.

Referring to Step 5, positive-type photoresist 1 on which a contrast enhancement layer is applied is selectively irradiated, using a mask 5.

Referring to Step 6, CEL layer 10 is removed by wet etching with organic solvent. Since the CEL layer is formed of soluble material, if it can be removed in the subsequent development process, the wet etching can be omitted.

Referring to Step 7, positive-type photoresist 1 is developed.

FIG. 11B is a conventional CEL technique, the conditions of which is the same as in the present embodiment, except that a CEL layer 6 is not adjusted to alkalinity.

Referring to FIGS. 11A and B for the purpose of comparison, the use of the contrast enhancement layer adjusted to alkalinity prevents the positive-type photoresist from being reduced even in the case of out of focus. On the other hand, with the conventional CEL layer, the positive-type photoresist 1 is reduced as shown in FIG. 11B.

Although the present invention is applied to the ARCOR method and the CEL technology in the aforementioned embodiments, the present invention is not limited to these cases. The present invention is applicable to any method employing an application film applied on a positive-type photoresist in order to pattern the positive-type photoresist with high accuracy.

As described above, according to the forming method of a fine resist pattern in the first aspect of the present invention, an application film adjusted to alkalinity is applied on a positive-type photoresist including naphthoquinone diazide and novolak resin, whereby crosslinking reaction of the naphthoquinone diazide and novolak resin included in the surface of the positive-type photoresist occurs with alkali included in the application film as a catalyst, causing the surface of the positive-type photoresist to change into an insoluble substance. Accordingly, even in the case of defocus, reduction of the positive-type photoresist is suppressed, whereby a fine resist pattern of high accuracy can be obtained.

According to the method of a fine resist pattern in the second aspect of the present invention, a contrast enhancement layer adjusted to alkalinity is applied on a positive-type photoresist including naphthoquinone diazide and novolak resin, whereby crosslinking reaction of the naphthoquinone diazide and the novolak resin included in the surface of the positive-type photoresist occurs with alkali included in the contrast enhancement layer as a catalyst, causing the surface of the positive-type photoresist to change into an insoluble substance. Accordingly, even in the case of defocus, reduction of the positive-type photoresist is suppressed, whereby a fine resist pattern of high accuracy can be obtained. In addition, since the contrast enhancement layer is applied on the positive-type photoresist, a resist pattern with enhanced contrast can be obtained.

According to the forming method of a fine resist pattern in the third aspect of the present invention, an anti-reflection film adjusted to alkalinity is applied on a positive-type photoresist including naphthoquinone diazide and novolak resin, whereby crosslinking reaction of the naphthoquinone diazide and novolak resin included in the surface of the positive-type photoresist occurs with alkali included in the anti-reflection film as a catalyst, causing the surface of the positive-type photoresist to change into an insoluble substance. Accordingly, even in the case of defocus, reduction of the positive-type photoresist is suppressed, whereby a fine resist pattern of high accuracy can be obtained. In addition, since the anti-reflection film is applied on the positive-type photoresist, multiple reflection in the film is suppressed, whereby the dimension of the resist pattern is made stable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A forming method of a fine resist pattern, comprising the steps of:
    applying on a substrate a positive photoresist including naphthoquinone diazide and novolak resin;
    applying an alkaline application film to a surface of said positive photoresist, thereby rendering said surface of said positive photoresist insoluble without immersing the photoresist in an alkali liquid;
    selectively irradiating said positive photoresist having said alkaline application film applied thereon with light;
    removing the application film by either development or wet etching with an organic solvent; and
    developing said positive photoresist after removing the application film.

2. A forming method of a fine resist pattern, comprising the steps of:
    applying on a substrate a positive photoresist including naphthoquinone diazide and novolak resin;
    applying an alkaline contrast enhancement layer to a surface of said positive photoresist, thereby rendering said surface of said positive photoresist insoluble without immersing the photoresist in an alkali liquid;
    selectively irradiating said positive photoresist having said alkaline contrast enhancement layer applied thereon with liquid;
    removing the contrast enhancement layer by either development or wet etching with an organic solvent; and
    developing said positive photoresist layer after removing the contrast enhancement layer.

3. The forming method according to claim 2, wherein said contrast enhancement layer is rendered alkaline by organic alkali.

4. The forming method according to claim 3, wherein said organic alkali includes tetramethyl ammonium hydroxide.

5. The forming method according to claim 2, wherein the pH of the alkalinity of said contrast enhancement layer is rendered not less than 10.

6. The forming method according to claim 2, further comprising the steps of
    baking said positive photoresist having said contrast enhancement layer applied thereon at a temperature in the range of 80°–100° C., prior to said irradiation.

7. A forming method of a fine resist pattern, comprising the steps of:
    applying on a substrate a positive photoresist including naphthoquinone diazide and novolak resin;
    applying an alkaline anti-reflection film to a surface of said positive photoresist, without immersing the photoresist in an alkali liquid, thereby rendering said surface of said positive photoresist insoluble;
    selectively irradiating said positive photoresist having said alkaline anti-reflection film applied thereon with light;
    removing the anti-reflection film by either development or wet etching with an organic solvent; and
    developing said positive photoresist after removing the anti-reflection film.

8. The forming method according to claim 7, wherein said anti-reflection film includes a water soluble polymer and a refraction index controller.

9. The forming method according to claim 8, wherein said water soluble polymer includes a polyvinyl alcohol polymer.

10. The forming method according to claim 8, wherein said water soluble polymer includes a polyacrylic acid polymer.

11. The forming method according to claim 8, wherein said water soluble polymer includes a polyvinyl amine polymer.

12. The forming method according to claim 8, wherein said refraction index controller includes a fluorine-containing polymer.

13. The forming method according to claim 8, wherein said refraction index controller includes a fluorine-containing surfactant.

* * * * *